United States Patent
Kim et al.

(10) Patent No.: US 10,847,742 B2
(45) Date of Patent: Nov. 24, 2020

(54) ELECTRODE, ORGANIC LIGHT EMITTING DIODE, LIQUID CRYSTAL DISPLAY DEVICE, AND ORGANIC LIGHT EMITTING DISPLAY DEVICE OF THE SAME

(71) Applicant: LG Display Co., Ltd., Seoul (KR)

(72) Inventors: Sunghee Kim, Paju-si (KR); Sungwook Ko, Seoul (KR); Jinwuk Kim, Goyang-si (KR); Suyeon Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 104 days.

(21) Appl. No.: 15/696,580

(22) Filed: Sep. 6, 2017

(65) Prior Publication Data
US 2018/0097196 A1    Apr. 5, 2018

(30) Foreign Application Priority Data
Sep. 30, 2016   (KR) .................. 10-2016-0127134

(51) Int. Cl.
*H01L 51/52*    (2006.01)
*G02F 1/1343*   (2006.01)

(52) U.S. Cl.
CPC ...... *H01L 51/5206* (2013.01); *G02F 1/13439* (2013.01); *G02F 1/134363* (2013.01); *G02F 2202/06* (2013.01); *H01L 2251/5323* (2013.01); *Y10T 428/1055* (2015.01)

(58) Field of Classification Search
CPC ............ H01L 51/5206; H01L 51/5215; H01L 51/5218; H01L 51/5296; H01L 51/441–445; H01L 51/102; H01L 51/4206; H01L 2251/5323; Y10T 428/1055; G02F 1/134439; G02F 1/134363; G02F 2202/06
USPC ...... 428/1.4; 349/51; 257/E31.123, E31.124, 257/E31.126; 977/762, 773, 775, 784; 136/244, 251, 265
See application file for complete search history.

(56) References Cited

U.S. PATENT DOCUMENTS 6,414,431 B1    7/2002  Yu et al.
2007/0074316 A1  3/2007  Alden et al.
(Continued)

FOREIGN PATENT DOCUMENTS

CN   103137870 A   6/2013
CN   103606389 A   2/2014
(Continued)

OTHER PUBLICATIONS

Notice of Reasons for Refusal, dated May 30, 2019, issued in corresponding Japanese Patent Application No. 2017-181859. Note: JP 2013-077419, JP 2013-114938, JP 2016-164241, and JP 2008-033284 cited therein is already of record.
(Continued)

*Primary Examiner* — Ruiyun Zhang
(74) *Attorney, Agent, or Firm* — Morgan, Lewis & Bockius LLP (57) ABSTRACT

Disclosed is an electrode including a conductive material and a dopant having a work function of at least 5.0 eV. The conductive material may be one selected from the group consisting of a metal particle having a reflectivity of at least 80%, a carbon allotrope, a conductive polymer, metal nanowire, and a mixture thereof.

12 Claims, 8 Drawing Sheets

(56) References Cited

U.S. PATENT DOCUMENTS

| | | | |
|---|---|---|---|
| 2007/0121193 A1* | 5/2007 | Akashi | G02F 1/167 |
| | | | 359/296 |
| 2008/0042288 A1 | 2/2008 | Yamazaki et al. | |
| 2011/0214728 A1* | 9/2011 | Veerasamy | B82Y 10/00 |
| | | | 136/256 |
| 2012/0138913 A1 | 6/2012 | Alsayed et al. | |
| 2012/0260983 A1 | 10/2012 | Pruneri et al. | |
| 2013/0092887 A1 | 4/2013 | Seshadri et al. | |
| 2014/0248544 A1* | 9/2014 | Xing | H01M 4/9016 |
| | | | 429/405 |
| 2016/0141103 A1* | 5/2016 | Hamanaka | H01G 4/012 |
| | | | 361/301.4 |
| 2016/0260518 A1 | 9/2016 | Hatakeyama et al. | |

FOREIGN PATENT DOCUMENTS

| | | |
|---|---|---|
| CN | 104218155 A | 12/2014 |
| CN | 106958017 A | 7/2017 |
| JP | 2002507319 A | 3/2002 |
| JP | 2005174832 A | 6/2005 |
| JP | 2008-033284 A | 2/2008 |
| JP | 2009-505358 A | 2/2009 |
| JP | 2010199079 A | 9/2010 |
| JP | 2013510397 A | 3/2013 |
| JP | 2013-077419 A | 4/2013 |
| JP | 2013-114938 A | 6/2013 |
| JP | 2013527974 A | 7/2013 |
| JP | 2014-120405 A | 6/2014 |
| JP | 2014120405 A * | 6/2014 |
| JP | 2015504446 A | 2/2015 |
| JP | 2016-164241 A | 9/2016 |
| KR | 10-2013-0116750 A | 10/2013 |
| KR | 10-2013-0116752 A | 10/2013 |
| WO | 2010/013520 A1 | 2/2010 |

OTHER PUBLICATIONS

First Office Action issued in corresponding Chinese Patent Application No. 201710902841.5, dated Dec. 28, 2018.

Office Action dated Sep. 27, 2018, issued in corresponding Japanese Patent Application No. 2017-181859.

Decision of Refusal dated Feb. 21, 2020, issued in corresponding Japanese Patent Application No. 2017-181859.

Decision of Dismissal of Amendment dated Feb. 21, 2020, issued in corresponding Japanese Patent Application No. 2017-181859.

* cited by examiner

ELECTRODE, ORGANIC LIGHT EMITTING DIODE, LIQUID CRYSTAL DISPLAY DEVICE, AND ORGANIC LIGHT EMITTING DISPLAY DEVICE OF THE SAME

This application claims the priority benefit of Korean Patent Application No. 10-2016-0127134 filed on Sep. 30, 2016, which is incorporated herein by reference for all purposes as if fully set forth herein.

BACKGROUND

Technical Field

The present invention relates to an electrode, an organic light emitting device including the same, a liquid crystal display device, and an organic light emitting display device.

Discussion of the Related Art

Recently, various flat panel display devices capable of reducing weight and volume, which are disadvantages of cathode ray tube (CRT), are being developed. Examples of these flat panel display devices may include a liquid crystal display (LCD) device, a field emission display (FED) device, a plasma display panel (PDP), an organic light emitting display (OLED) device, etc.

Among them, the organic light emitting display device is a self-luminous display device which electrically excites an organic compound to emit light. The organic light emitting display device does not require a backlight used in a liquid crystal display device, and thus it can not only be lightweight and thin, but also can simplify the process. In addition, the organic light emitting display device can be manufactured at a low temperature, has a high response speed of 1 ms or less, and exhibits characteristics such as low power consumption, wide viewing angle, and high contrast.

An organic light-emitting display device includes a light-emitting layer consisting of an organic material between a first electrode, which is an anode having a high work function, and a second electrode, which is a cathode having a low work function. The holes supplied from the first electrode and the electrons received from the second electrode are combined within the light emitting layer to form excitons which are hole-electron pairs, and the excitons emit light due to the energy generated when the excitons return to the ground state. The organic light emitting display device may be divided into a bottom light emitting structure, in which the light emitted from the light emitting layer is transmitted through the first electrode to be emitted to the bottom surface, and a top light emitting structure, which is reflected from the first electrode to be emitted to the top surface.

Figure 1:
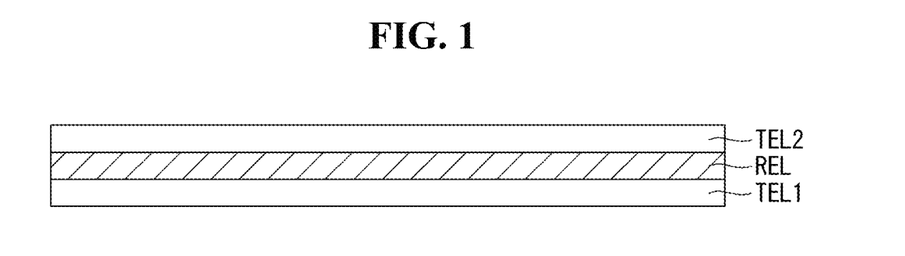
FIG. 1 is a view showing a cross-sectional structure of a first electrode.
Figure 2:
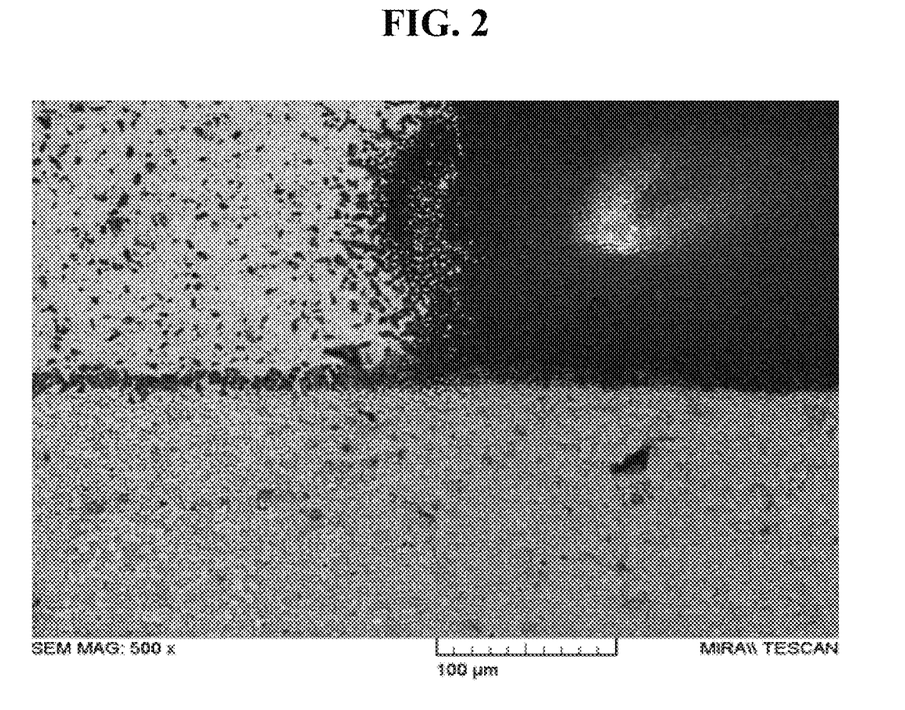
FIG. 2 is an SEM image of a first electrode.

FIG. 1 shows a cross-sectional structure of the first electrode and FIG. 2 shows an SEM image of the first electrode.

Referring to FIG. 1, the first electrode provided in the front light emitting structure has a structure of a transparent conductive layer (TEL1)/reflective layer (REL)/transparent conductive layer (TEL2), so as to reflect light. The reflective layer (REL) is mostly used a silver (Ag) or a silver alloy having a high reflectance. The first electrode is subjected to a patterning by sequentially laminating the transparent conductive layer (TEL1)/reflective layer (REL)/transparent conductive layer (TEL2) followed by one-step etching, and sides of the reflective layer are exposed to the etchant and cause the migration of the silver or silver alloy. As shown in FIG. 2, it appeared that a silver migration occurred because the silver or silver alloys appearing in black were not densely arranged and they were not present in some portions, etc. As a result, there is a problem in that adjacent first electrodes are not insulated but short-circuited, resulting in defective driving.

Additionally, an organic light emitting display device should be provided with a first electrode having a high work function and excellent transparency and conductivity in a front light emitting structure or rear light emitting structure. Indium tin oxide (ITO) is widely used because of its high work function and excellent transparency and conductivity. However, indium (In), which is a main raw material, is a rare metal and is expensive, and its supply is becoming difficult due to the export policies of resource-rich countries. Accordingly, the research for replacing Indium tin oxide (ITO) is being continued.

SUMMARY

Accordingly, embodiments of the present disclosure are directed to an electrode, an organic light emitting diode, liquid crystal display device, and organic light emitting display device of the same that substantially obviate one or more of the problems due to limitations and disadvantages of the related art.

An aspect of the present invention is to provide an electrode capable of preventing defective driving by a first electrode and capable of replacing ITO, an organic light emitting device including the same, a liquid crystal display device, and an organic light emitting display device, etc.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an electrode comprises a conductive material and a dopant having a work function of at least 5.0 eV.

The conductive material may be one selected from the group consisting of a metal particle having a reflectivity of at least 80%, a carbon allotrope, a conductive polymer, metal nanowire, and a mixture thereof.

The metal particle having a reflectivity of at least 80% is one selected from the group consisting of sodium (Na), silver (Ag), aluminum (Al), magnesium (Mg), tin (Sn), gold (Au), and a mixture thereof.

The carbon allotrope is one selected from reduced graphene oxide (rGO), non-oxidized graphene, graphene nanoribbon, carbon nanotube (CNT), and a mixture thereof.

The dopant having a work function of at least 5.0 eV is one selected from the group consisting of palladium (Pd), nickel (Ni), platinum (Pt), selenium (Se), gold (Au), cobalt (Co), iridium (Ir), osmium (Os), and a mixture thereof.

The electrode has a work function of at least 4.8 eV.

The conductive polymer is one selected from the group consisting of a conductive polymer not comprising a heteroatom, which includes polyfluorene, polyphenylene, polypyrene, polyazulene, polynaphthalene, polyacetylene (PAC), and poly(p-phenylene vinylene) (PPV); a conductive polymer comprising nitrogen (N) as a heteroatom, which includes polypyrrole (PPY), polycarbazole, polyindole, polyazepine, poly(thienylene vinylene), and polyaniline (PAM); a conductive polymer comprising sulfur (S) as a heteroatom, which includes poly(thiophene) (PT), poly(p-phenylene sulfide) (PPS), and poly(3,4-ethylenedioxy thiophene) (PEDOT); a conductive polymer comprising oxygen (O) as a heteroatom, which includes polyfuran; or any of the conductive polymers in which a different material is doped on any of these conductive polymers; or a combination thereof.

The electrode further comprises a polymer resin.

In another aspect, an organic light emitting device comprises a first electrode, which comprises a conductive material and a dopant having a work function of at least 5.0 eV, an organic layer, which comprises a light emitting layer on the first electrode, and a second electrode on the organic layer.

The conductive material may be one selected from the group consisting of a metal particle having a reflectivity of at least 80%, a carbon allotrope, a conductive polymer, metal nanowire, and a mixture thereof.

The metal particle having a reflectivity of at least 80% is one selected from the group consisting of sodium (Na), silver (Ag), aluminum (Al), magnesium (Mg), tin (Sn), gold (Au), and a mixture thereof.

The carbon allotrope is one selected from the group consisting of reduced graphene oxide (rGO), non-oxidized graphene, graphene nanoribbon, carbon nanotube (CNT), and a mixture thereof.

The dopant having a work function of at least 5.0 eV is one selected from the group consisting of palladium (Pd), nickel (Ni), platinum (Pt), selenium (Se), gold (Au), cobalt (Co), iridium (Ir), osmium (Os), and a mixture thereof.

The electrode has a work function of at least 4.8 eV.

The conductive polymer is one selected from the group consisting of a conductive polymer not comprising a heteroatom, which includes polyfluorene, polyphenylene, polypyrene, polyazulene, polynaphthalene, polyacetylene (PAC), and poly(p-phenylene vinylene) (PPV); a conductive polymer comprising nitrogen (N) as a heteroatom, which includes polypyrrole (PPY), polycarbazole, polyindole, polyazepine, poly(thienylene vinylene), and polyaniline (PAM); a conductive polymer comprising sulfur (S) as a heteroatom, which includes poly(thiophene) (PT), poly(p-phenylene sulfide) (PPS), and poly(3,4-ethylenedioxy thiophene) (PEDOT); a conductive polymer comprising oxygen (O) as a heteroatom, which includes polyfuran; or any of the conductive polymers in which a different material is doped on any of these conductive polymers; and a combination thereof.

The first electrode is a reflective electrode or transparent electrode.

The organic layer further comprises an organic layer, a hole transport layer, and an electron transport layer, an electron injection layer, and the first electrode is in contact with the hole transport layer.

The first electrode further comprises a polymer resin.

In another aspect, a liquid crystal display comprises a first substrate including a thin film transistor, a second substrate facing the first substrate, an electrode, which is disposed on the thin film transistor and electrically connected to the thin film transistor, and a liquid crystal layer disposed between the first and second substrates.

In another aspect, an organic light emitting display device comprises a substrate including a thin film transistor, an organic light emitting device, which is disposed on the thin film transistor and electrically connected to the thin film transistor, and an encapsulation layer disposed on the organic light emitting device.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Hereinafter, exemplary embodiments of the present invention will be described in detail with reference to illustrative drawings. In adding reference numerals to the constituent elements of the drawings, it should be noted that throughout the specification the same constituting elements are denoted by the same reference symbols as possible even if they are displayed on different drawings, like reference numerals denote substantially like components. Additionally, in explaining the exemplary embodiments of the present invention, if it is determined that the detailed description with regard to known functions or configurations related to the invention may obscure the gist of the invention, detailed description thereof will be omitted.

In explaining the constituent elements of the invention, terms such as a first, a second, A, B, (a), and (b) may be used. These terms are intended to distinguish the constituent elements from other constituent elements, and the nature, order, sequence, etc., of the constituent elements are not limited by these terms. When a constituent element is described as being "linked", "coupled", or "connected" with another constituent element, it may be understood that the constituent element is directly linked, coupled, or connected to the different constituent element, but it may also be understood that the different constituent element is linked, coupled, or connected between each of the constituent elements. In the same context, when a constituent element is described as being formed "on" or "below" of a different constituent element, it should be understood to include a case where the constituent element is directly formed on the different constituent element and a case where the constituent element is indirectly formed by interposing an another different constituent element to the different constituent element.

The display device according to the present invention described below may be an organic light emitting display device, a liquid crystal display device, an electrophoretic display device, etc. In the present invention, the organic light emitting display device is described as an exemplary embodiment. The organic light emitting display device includes a first electrode and a second electrode connected to a thin film transistor, and a light emitting layer, made of an organic material, disposed therebetween. Therefore, the holes supplied from the first electrode and the electrons supplied from the second electrode are combined in the light emitting layer to form excitons, which are hole-electron pairs, and the excitons emit light by energy generated as they return to the ground state. The electrode of the present invention described below may be used as the first electrode of the organic light emitting display device. Further, the present invention is not limited thereto and can be used for a pixel electrode or a common electrode of a liquid crystal display.

Hereinafter, exemplary embodiments of the present invention will be described with reference to the accompanying drawings.

Figure 3:
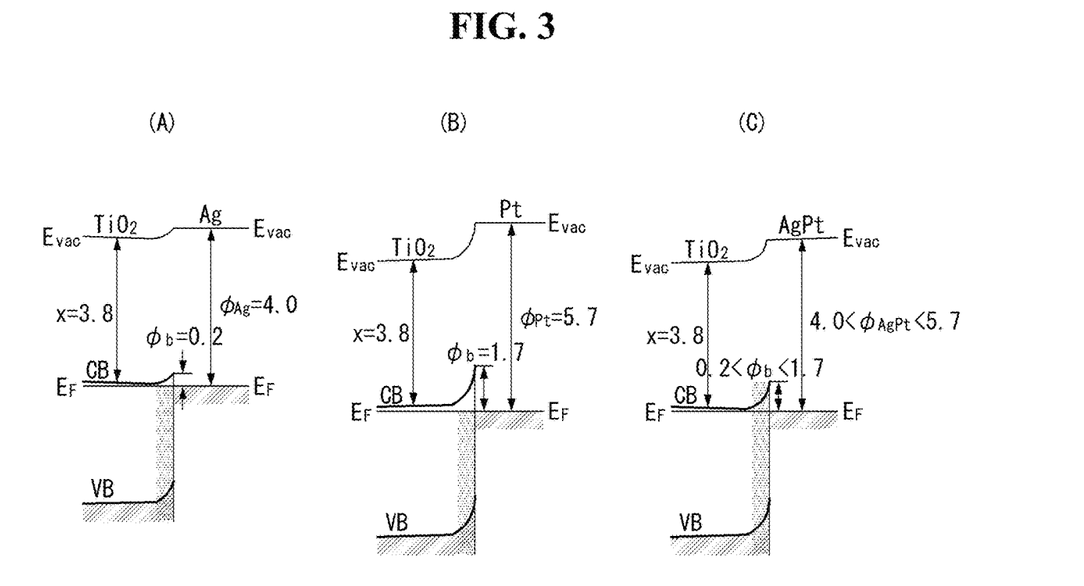
FIG. 3 is a view showing work functions of dopants.
Figure 4:
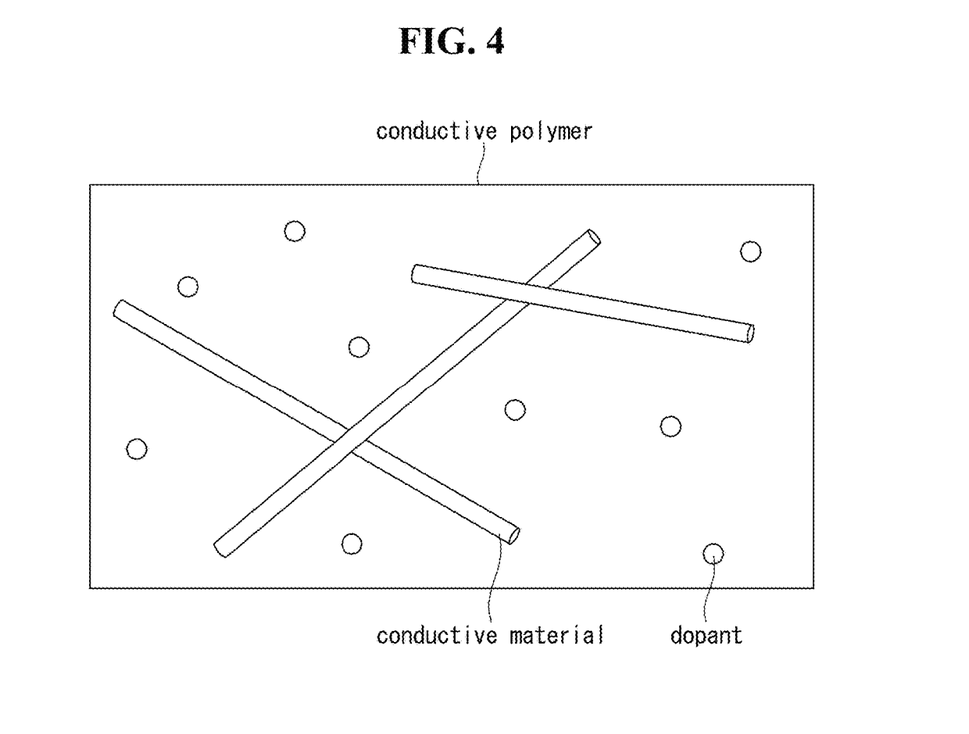
FIG. 4 is a view showing an electrode according to an exemplary embodiment of the present invention.

FIG. 3 is a view showing the work functions of dopants and FIG. 4 is a view showing an electrode according to an exemplary embodiment of the present invention The present invention discloses an electrode to be used as a first electrode of an organic light emitting display device. More specifically, the electrode is manufactured using an electrode composition containing a conductive material, a dopant having a work function of at least 5.0 eV or more, and a solvent.

<Conductive Material>

The conductive material of the present invention serves to exhibit the conductivity of an electrode, and a metal particle, a carbon allotrope, a conductive polymer, or a metal nanowire having a reflectance of at least 90% may be used as the conductive material.

When an electrode is required to have a reflective property, a metal particle having a reflectance of at least 80% may be used as the conductive material. Examples of the metal particle having a reflectance of at least 80% may be silver (Ag), sodium (Na), aluminum (Al), magnesium (Mg), tin (Sn), or gold (Au). In particular, the reflectance is the reflectance for 598 nm which is a sodium D line. The reflectance of silver (Ag) is 94%, the reflectance of sodium (Na) is 90%, the reflectance of aluminum (Al) is 83%, the reflectance of magnesium (Mg) is 82%, the reflectance of tin (Sn) is 82%, and the reflectance of gold (Au) is 80%. As the conductive material of the present invention, at least one or a mixture of at least two of the above-mentioned metal particles may be used.

In a case where an electrode requires transparency, a carbon allotrope may be used as the conductive material. The carbon allotrope disclosed in the present invention represents a polycyclic aromatic molecule having carbon atoms covalently bonded to each other. The covalently-bonded carbon atoms may form a 6-membered ring as a repeating unit, and additionally, may also include at least one selected from a 5-membered ring and a 7-membered ring. A carbon allotrope may be a single layer or it may include multiple carbon allotrope layers stacked on a different layer of a carbon allotrope. A carbon allotrope may have a one- or two-dimensional structure. A carbon allotrope has a maximum thickness of about 100 nm, specifically from about 10 nm to about 90 nm, and more specifically from about 20 nm to about 80 nm.

A carbon allotrope may be manufactured largely by four different methods such as physical exfoliation, chemical vapor deposition, chemical exfoliation, and epitaxial synthesis. Physical exfoliation is a method of attaching a scotch tape to a graphite sample and then removing it so as to obtain a carbon allotrope sheet detached from graphite on the surface of the scotch tape. Chemical vapor deposition is a method for growing crystalline allotropes of carbon by absorbing/decomposing carbon precursors in gas or vapor form with high kinetic energy on the surface of a substrate, where the crystalline allotropes of carbon are intended to be grown, so as to separate carbon atoms and establishing the formation of atomic bonds between the corresponding carbon atoms. Chemical exfoliation utilizes the oxidation-reduction characteristics of graphite and the graphite is added into a mixture of sulfuric acid and nitric acid and carboxyl compounds are attached to the edges of carbon allotrope plates. The resultant is converted to an acid chloride by chlorinated thinol and then again formed into a carbon allotrope amide using octadecylamine. When the carbon allotrope amide is recovered using a solution such as tetrahydrofuran, there occurs pulverization and individual carbon allotrope sheets are obtained. Epitaxial synthesis is a method for obtaining carbon allotropes by heating silicon carbide (SiC) at a high temperature of 1,500° C. and thereby silicon (Si) is removed and carbon allotropes are obtained by the remaining carbons.

The carbon allotrope to be used in the present invention may include reduced graphene oxide (rGO), non-oxidized graphene, graphene nanoribbon, carbon nanotube (CNT), etc. Reduced graphene oxide (GO) is a reduced form of graphene oxide, and reduced graphene oxide can be prepared by reducing graphene oxide, which is prepared by adding a strong acid to graphite to be oxidized and chemically formed into small particles. Non-oxidized graphene refers to a carbon allotrope which is prepared by a method among the above-described methods for preparing a carbon allotrope, other than the oxidation-reduction process. Graphene nanoribbons are prepared by cutting graphene in the form of a ribbon with a nanometer width and have a constant energy bandgap according to their width. The graphene nanoribbons may be synthesized from monomers containing a carbon allotrope or by cutting carbon nanotubes and spreading them into planes. In addition to the above-described types of carbon allotropes, known carbon allotrope structures such as graphene nanomesh, etc., may be used for the carbon allotrope of the present invention.

Additionally, a conductive polymer may be used as a conductive material when the electrode requires transparency. A conductive polymer is an organic polymer that possesses the unique characteristics of polymers being lightweight, easy to process, and has electrically-conductive, and has a conjugated bond in which a single bond and a double bond are alternately formed. A conductive polymer includes not only a pure conductive polymer but also a conductive polymer that is doped by other appopriate materials.

Examples of the conductive polymer may include a conductive polymer which does not contain a heteroatom, such as polyfluorene, polyphenylene, polypyrene, polyazulene, polynaphthalene, polyacetylene (PAC), and poly(p-phenylene vinylene) (PPV); a conductive polymer which contains nitrogen (N) as a heteroatom, such as polypyrrole (PPY), polycarbazole, polyindole, polyazepine, poly(thienylene vinylene), and polyaniline (PAM); a conductive polymer which contains sulfur (S) as a heteroatom, such as poly(thiophene) (PT), poly(p-phenylene sulfide) (PPS), and poly(3,4-ethylenedioxy thiophene) (PEDOT); a conductive polymer which contains oxygen (O) as a heteroatom, such as polyfuran; or any of the conductive polymers in which a different material is doped on any of these conductive polymers; or a combination thereof. These conductive polymers may be in a form having a substitution therein with an appropriate substituent (e.g., an aromatic ring, such as an alkyl group, an alkoxy group, etc., and an aliphatic ring).

As a conductive polymer, preferably, a conductive polymer doped with another material or a material having a substitution with an appropriate functional group therein may be used so as to improve dispersibility or conductivity with respect to a solvent. For example, in polyacetylene as a conductive polymer, a dopant such as halogen a gase (e.g., $I_2$ and $Br_2$), an alkali metal (e.g., Li and Na), and $AsF_6$ may be used as a dopant. Additionally, $BF^{4-}$, $ClO^{4-}$, etc., may be used as a dopant for polypyrrole, polythiophene, polyazulene, polyfuran, etc., and $AsF_6$ may be used as a dopant for polyphenylene sulfide, polyphenylene vinylene, polythienylene vinylene, polyphenylene, etc., in addition to polyacetylene. Meanwhile, hydrochloric acid (HCl), dodecylbenzene sulfonic acid (DBSA), camphor sulfonic acid (CSA), etc., may be used as a dopant for polyaniline. In the case of polypyrrole, a tosyl group such as p-methylphenyl sulfonate may be used as an a dopant in addition to the above-mentioned $BF^{4-}$ and $ClO^{4-}$, for polythiophene, a tosyl group, such as p-methylphenyl sulfonate, and $FeCl_4$ may also be used as a dopant; and, for polyphenylene, an alkali metal such as Li and K may be used as a dopant in addition to $AsF_6$.

In particular, as a conductive polymer of the present invention, a conductive polymer containing PEDOT as a main component may be used, for example, PEDOT, poly (3,4-ethylenedioxy thiophene) (PEDOT) doped with poly (styrene sulfonate) (PSS) (PEDOT:PSS), or poly(3,4-ethylenedioxy thiophene)-tetramethacrylate (PEDOT-TMA).

In the PEDOT:PSS, the sulfonic acid group of PSS is deprotonated in a solvent and is negatively charged, and may function as a dispersant. Meanwhile, PEDOT is a conductive polymer of a π conjugated system, and the PEDOT moiety is positively charged. Specifically, it has good dispersibility to a hydrophilic solvent and thus can form a stable salt. Upon addition into an appropriate solvent such as water in the presence of PSS, EDOTs (i.e., monomers of PEDOT) can form an acidic aqueous dispersion solution, and thus the PEDOT:PSS solution can form a stable dispersant while forming an oxidative polymerization. PEDOT-TMA, the other conductive polymer, may be used as an alternative to replace the PEDOT:PSS because of its excellent dispersibility in organic solvents and non-corrosive nature.

Additionally, metal nanowire may be used as a conductive material. Metal nanowire refers to a wire-shaped metal having a diameter of several nanometers to several tens of nanometers. The representative example of metal nanowire may include silver nanowire, and in addition, the metal nanowire may consist of at least one element selected from the group consisting of gold (Au), nickel (Ni), copper (Cu), palladium (Pd), platinum (Pt), iridium (Ir), ruthenium (Ru), osmium (Os), iron (Fe), cobalt (Co), tin (Sn), aluminum (Al), zinc (Zn), titanium (Ti), tungsten (W), molybdenum (Mo), and chromium (Cr).

<Dopant having work function of at least 5.0 eV>

The present invention provides a dopant having a work function of at least 5.0 eV so as to increase the work function of an electrode. Examples of dopants that have a work function of at least 5.0 eV may include palladium (Pd), nickel (Ni), platinum (Pt), selenium (Se), gold (Au), cobalt (Co), iridium (Ir), and osmium (Os). Palladium (Pd) has a work function of 5.22 eV to 5.6 eV, nickel (Ni) has a work function of 5.04 eV to 5.35 eV, platinum (Pt) has a work function of 5.12 eV to 5.93 eV, selenium (Se) has a work function of 5.9 eV, gold (Au) has a work function of 5.1 eV to 5.47 eV, cobalt (Co) has a work function of 5.0 eV, iridium (Ir) has a work function of 5.0 eV to 5.67 eV, and osmium (Os) has a work function of 5.93 eV. As a dopant having a work function of at least 5.0 eV, one kind or a mixture of at least two kinds of the dopants described above may be used.

<Solvent>

The solvent of the present invention is used for dispersing the above-mentioned conductive materials and controlling the viscosity of the composition to be coated thereon. The solvent to be used may be a hydrophilic or hydrophobic solvent. As the hydrophilic solvent, one solvent selected from the group consisting of water; alcohols such as ethanol, methanol, isopropyl alcohol, butanol, 2-ethylhexyl alcohol, methoxy pentanol, butoxy ethanol, ethoxyethoxy ethanol, butoxyethoxy ethanol, methoxypropoxy propanol, texanol, terpineol (e.g., α-terpineol); tetrahydrofuran (THF); glycerol, alkylene glycols such as ethylene glycol, triethylene glycol, polyethylene glycol, propylene glycol, dipropylene glycol, and dihexylene glycol, or alkyl ethers thereof (e.g., propylene glycol methyl ether (PGME), diethylene glycol butyl ether, diethylene glycol ethyl ether, dipropylene glycol methyl ether, dihexylene glycol ethyl ether); glycerin, N-methyl-2-pyrrolidinone (NMP), 2-pyrrolidone, acetylacetone, 1,3-dimethylimidazolidone, thiodiglycol, dimethyl sulfoxide (DMSO), N,N-dimethyl acetamide (DMAc), dimethylformamide (DMF)), sulfolane, diethanolamine, and triethanolamine, or a mixture of at least two kinds thereof may be used.

As the hydrophobic solvent, one selected from the group consisting of ketones such as methyl ethyl ketone and cyclopentanone; aromatic compounds such as xylene, toluene, and benzene; ethers such as dipropylene methyl ether; and aliphatic hydrocarbons such as methylene chloride and chloroform, or a mixture of at least two kinds thereof may be used.

<Polymer Resin>

The electrode composition of the present invention may further contain a polymer resin. The polymer resin has the role of attaching, binding, or dispersing a conductive material. The polymer resin may be one kind selected from the group consisting of acrylic resin, polyimide resin, phenol resin, cardo resin, styrene resin, novolac resin, and polyester resin, or a mixture of at least two kinds thereof. Additionally, these resins may be compounds containing an acid group or epoxy group.

<Additive>

The electrode composition of the present invention may further contain an additive such as an adhesion promoter or leveling agent.

The adhesion promoter is an agent for improving the adhesion between an electrode and a lower layer, and one kind selected from the group consisting of vinyltrimethoxysilane, vinyltriethoxysilane, vinyltris(2-methoxyethoxy)-silane, N-(2-aminoethyl)-3-aminopropylmethyldimethoxysilane, N-(2-aminoethyl)-3-aminopropylmethyltrimethoxysilane, 3-aminopropyltriethoxysilane, 3-glycidoxypropyltriethoxysilane, 3-glycidoxypropylmethyldimethoxysilane, 2-(3,4-ethoxycyclohexyl)ethyltrimethoxysilane, 3-chloropropyl methyldimethoxysilane, 3-chloropropyl trimethoxy silane, 3-methacryloxypropyltrimethoxysilane, 3-mercaptopropyltrimethoxysilane, etc., or a mixture of at least two kinds thereof may be used.

The leveling agent alleviates the reduction of miscibility between a conductive material and a polymer resin caused by the surface tension of the electrode composition and reduces defects that may occur due to the non-uniformity of a film. As the leveling agent, one kind selected from the group consisting of for example, an anionic copolymer, aralkyl-modified polymethylalkylsiloxane, etc., or a mixture of at least two kinds thereof may be used.

Furthermore, the electrode composition of the present invention may further contain additives such as a dispersing agent and a plasticizer, in addition to the adhesion promoter and leveling agent.

The electrode composition of the present invention may be prepared by mixing a conductive material paste, in which a conductive material and a solvent are mixed, with dopant powder having a work function of at least 5.0 eV. In particular, a content of the dopant powder having a work function of at least 5.0 eV may be 2 wt % to 10 wt % based on 100 wt % of the conductive material paste. In particular, when the content of the dopant powder having a work function of at least 5.0 eV is equal to or greater than 2 wt % based on 100 wt % of the conductive material paste, the work function of the electrode is increased and sintering degree is improved and thereby the film quality of the electrode is improved, whereas when the content of the dopant powder having a work function of at least 5.0 eV is equal to or less than 10 wt % based on 100 wt % of the conductive material paste, the coating property and the reflectance of the composition can be prevented from being lowered.

The electrode composition may be coated using a known solution-coating method such as spin coating, slit coating, inkjet printing, etc. The electrode composition coated on a substrate can form an electrode by removing the solvent via heat treatment at 100° C. to 500° C.

The electrode to be prepared using the electrode composition described above may be prepared into an electrode having various characteristics. For example, the electrode may be an electrode having high reflectance and work function or an electrode having a high transmittance and a work function.

When the electrode of the present invention requires a high reflectance and a high work function, the electrode may include metal particles having a reflectance of at least 80% and a dopant having a work function of at least 5.0 eV.

The conductive material may be contained in an amount of 10 wt % to 80 wt % relative to 100 wt % of the total electrode composition so as to increase the reflectance of the electrode.

The dopant having a work function of at least 5.0 eV can increase the work function of an electrode. As shown in FIG. 3, when silver (Ag) has a work function of 4.0 eV (FIG. 3(A)) and platinum (Pt) has a work function of 5.7 eV (FIG. 3(B)), the work function of Ag—Pt may be controlled to a range between 4.0 eV to 5.7 eV. When a $TiO_2$ film having a work function of 3.8 eV is mixed with an Ag—Pt alloy, it can improve the work function of the $TiO_2$ film. Accordingly, the electrode of the present invention can increase the work function by including a dopant having a work function of at least 5.0 eV. Preferably, the electrode may have a work function of at least 4.8 eV.

Additionally, an electrode having a high reflectance and a high work function may further contain a polymer resin. A polymer resin is used for the attachment of a conductive material and a binder may be used, and preferably an acrylic binder may be used.

Additionally, when the electrode of the present invention requires a high transmittance and a high work function, the electrode may include a conductive material and a dopant having a work function of at least 5.0 eV, and the conductive material may further contain a conductive polymer.

As shown in FIG. 4, an electrode may include at least 2 kinds of conductive materials and a dopant having a work function of at least 5.0 eV. For the purpose of providing a high transmittance to an electrode, a nano-sized carbon allotrope or metal nanowire, and a conductive polymer may be used along with the carbon allotrope or metal nanowire. A conductive polymer is used to match a work function and secure surface emission and surface roughness characteristics. In addition, the electrode may further contain a polymer resin, and a polymer resin is used for bonding of conductive materials and a binder resin may be used as the polymer resin. Additionally, the work function of the electrode can be increased by including a dopant having a work function of at least 5.0 eV.

The above-described electrode of the present invention can be used in a liquid crystal display device, an organic light emitting display device, and as a first electrode of an organic light emitting device.

Application Example

Figure 5:
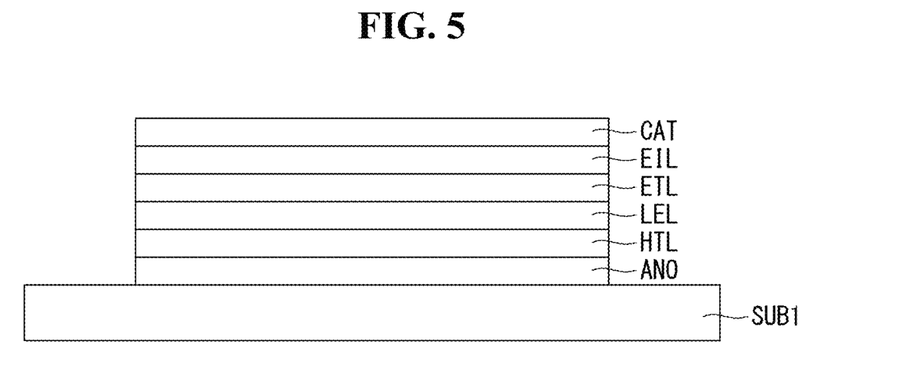
FIG. 5 is a cross-sectional view showing an organic light emitting device according to a first exemplary embodiment of the present invention.
Figure 6:
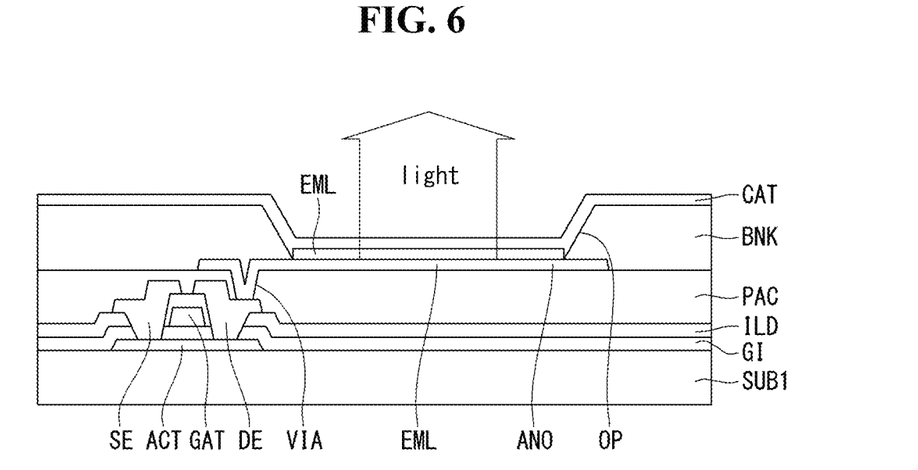
FIG. 6 is a cross-sectional view showing an organic light emitting display device according to a second exemplary embodiment of the present invention.
Figure 7:
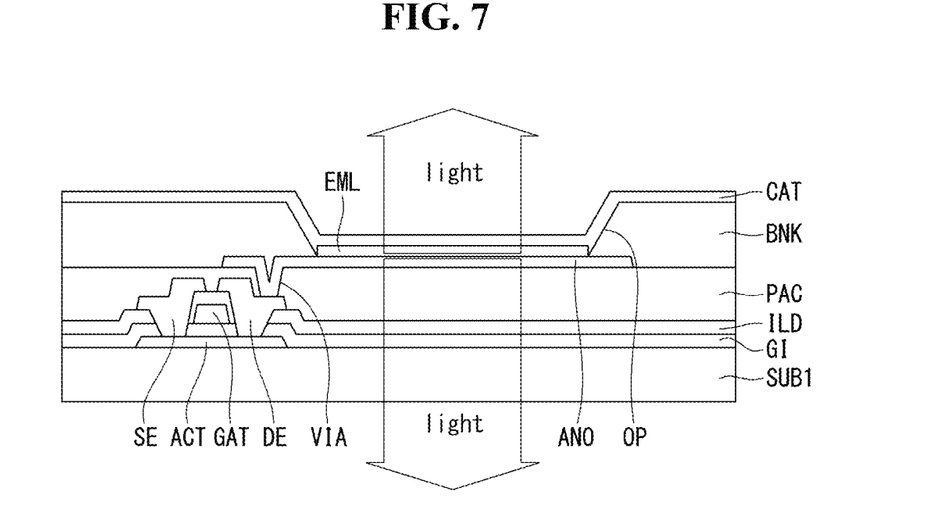
FIG. 7 is a cross-sectional view showing an organic light emitting display device according to a third exemplary embodiment of the present invention.
Figure 8:
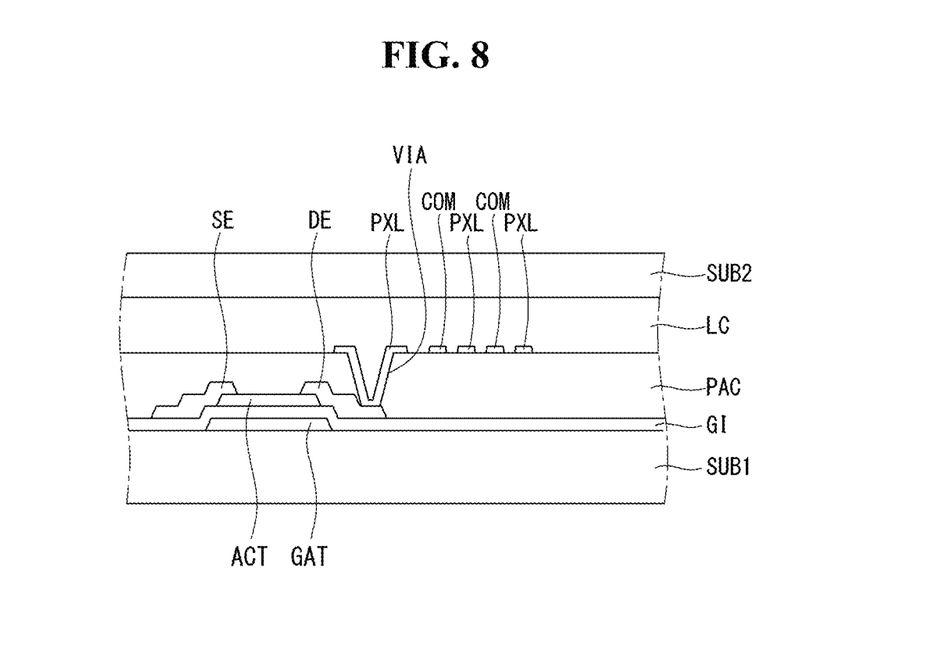
FIG. 8 is a cross-sectional view showing a liquid crystal display device according to a fourth exemplary embodiment of the present invention.

FIG. 5 is a cross-sectional view showing an organic light emitting device according to a first exemplary embodiment of the present invention; FIG. 6 is a cross-sectional view showing an organic light emitting display device according to a second exemplary embodiment of the present invention; FIG. 7 is a cross-sectional view showing an organic light emitting display device according to a third exemplary embodiment of the present invention; and FIG. 8 is a cross-sectional view showing a liquid crystal display device according to a fourth exemplary embodiment of the present invention.

Referring to FIG. 5, the organic light emitting device according to the first exemplary embodiment of the present invention has a first electrode (ANO) disposed on a substrate (SUB1), and a hole transport layer (HTL), an emission layer (LEL), an electron transport layer (ETL), an electron injection layer (EIL), and a second electrode (CAT) are disposed on the first electrode. The organic light emitting device of the present invention may apply the above-described electrode to the first electrode (ANO) of the organic light emitting device. Since the electrode of the present invention has a high work function of at least 4.8 eV and may thus be used as the first electrode of the organic light emitting device. In particular, as described above, an electrode may be used as a reflective electrode by adding a high reflectance characteristic to the electrode by varying the composition of the electrode, or as a transparent electrode by adding a high transmittance characteristic to the electrode.

Additionally, when the electrode according to the present invention is used as a first electrode as in the first exemplary embodiment, it makes the hole injection easy, thus not requiring a separate hole injection layer (HIL). Accordingly, the hole injection layer (HIL) may be omitted and the hole transport layer (HTL) may be formed on the first electrode thereby making the first electrode come in contact with the hole transport layer (HTL).

Meanwhile, referring to FIG. 6, the organic light emitting display device according to the second exemplary embodiment of the present invention may include the organic light emitting device of FIG. 5.

More specifically, an active layer (ACT) is disposed on the substrate (SUB1). The active layer (ACT) may be made of a silicon semiconductor or oxide semiconductor. The silicon semiconductor may include amorphous silicon or crystallized polycrystalline silicon, which in this exemplary embodiment may be an active layer (ACT) made of polycrystalline silicon. The gate insulating film (GI) is disposed on the active layer (ACT). The gate insulating film (GI) may be a silicon oxide ($SiO_x$), a silicon nitride ($SiN_x$), or a multilayer thereof. A gate electrode (GAT) is disposed on the gate insulating film (GI) so as to correspond to the active layer (ACT). The gate electrode (GAT) is made of at least one selected from the group consisting of molybdenum (Mo), aluminum (Al), chromium (Cr), gold (Au), titanium (Ti), nickel (Ni), neodymium (Nd), and copper (Cu), or an alloy thereof. Additionally, the gate electrode (GAT) may be a multilayer made of one selected from the group consisting of molybdenum (Mo), aluminum (Al), chromium (Cr), gold (Au), titanium (Ti), nickel (Ni), neodymium (Nd), and copper (Cu), or an alloy thereof. For example, the gate electrode (GAT) may be a double layer made of molybdenum/aluminum-neodymium or molybdenum/aluminum.

An interlayer dielectric (ILD) is disposed on the gate an electrode (GAT). The interlayer insulating film (ILD) may be a silicon oxide film ($SiO_x$), a silicon nitride film ($SiN_x$), or a multilayer thereof. A source electrode (SE) and a drain electrode (DE), which are electrically connected to the semiconductor layer (ACT), are disposed on the interlayer insulating film (ILD). The source electrode (SE) and the drain electrode (DE) may be a single or multiple layer. When the source electrode (SE) and the drain electrode (DE) are single layers, they may be made of at least one selected from the group consisting of molybdenum (Mo), aluminum (Al), chromium (Cr), gold (Au), titanium (Ti), nickel (Ni), neodymium (Nd), and copper (Cu), or an alloy thereof. Additionally, when the source electrode (SE) and the drain electrode (DE) are multiple layers, they may be made of a double layer of molybdenum/aluminum-neodymium or a triple layer of titanium/aluminum/titanium, molybdenum/aluminum/molybdenum, or molybdenum/aluminum-neodymium/molybdenum. Accordingly, a thin film transistor including a semiconductor layer (ACT), a gate electrode (GAT), a source electrode (SE), and a drain an electrode (DE) is formed.

An organic insulating film (PAC) is disposed on a substrate (SUB1) including a thin film transistor. The organic insulating film (PAC) may be a planarized film for alleviating the step of a lower structure and is made of an organic material such as polyimide, benzocyclobutene series resin, acrylate, etc. The organic insulating film (PAC) includes a via hole (VIA) for exposing the drain electrode (DE).

A first electrode (ANO) is disposed on the organic insulating film (PAC). The first electrode (ANO) may be an anode and is an electrode with a high reflectance and a high work function, and the first electrode (ANO) contains a conductive material, a polymer resin, and a a dopant having a high work function of at least 5.0 eV. Thus, the first electrode (ANO) acts as a reflective electrode that reflects light upward. The first electrode (ANO) fills in the via hole (VIA) and is connected to the drain electrode (DE).

A bank layer (BNK) is disposed on the substrate (SUB1) including a first electrode (ANO). The bank layer (BNK) may be a pixel defining film that defines a pixel by exposing a portion of the first electrode (ANO). The bank layer (BNK) is made of an organic material such as polyimide, benzocyclobutene series resin, acrylate, etc. The bank layer BNK is provided with an opening (OP) that exposes the first electrode (ANO).

An organic layer (EML) is disposed on the first electrode (ANO) exposed by the opening (OP) of the bank layer (BNK). The organic layer (EML) is a layer in which electrons and holes are combined to emit light and it includes at least a light emitting layer. Additionally, the organic layer (EML) may include at least one selected from the group consisting of a hole injection layer, a hole transport layer, an electron transport layer, and an electron injection layer, and at least any one of them may be omitted. A second electrode (CAT) is disposed on the substrate (SUB1) where the organic layer (EML) is formed. The second electrode (CAT) is a cathode electrode and it may be made of magnesium (Mg), calcium (Ca), aluminum (Al), or silver (Ag), which have a low work function, or an alloy thereof. Accordingly, an organic light emitting device including a first electrode (ANO), an organic layer (EML), and a second electrode (CAT) is included. Although not shown, an encapsulation layer of an inorganic or organic film that encapsulates the underlying elements on top of the second electrode (CAT) may be further included. The organic light emitting display device of this exemplary embodiment has a front emission structure in which light is emitted in the direction of a second electrode (CAT) and the second electrode (CAT) is made thin to allow transmission of light.

The organic light emitting display device of FIG. 6 described above is an organic light emitting display device of a front light emitting structure in which light emitted from an organic layer is reflected by a first electrode and discharged toward a second electrode. The electrode of the present invention may include a conductive material, a polymer resin, and a dopant having a work function of at least 5.0 eV, and for example, an electrode with high reflectance and work function may be provided by including a metal particle having a reflectance of at least 80%, a polymer resin, and a dopant having a work function of at least 5.0 eV. Therefore, the electrode of the present invention has an advantage in that it can provide an electrode of a single layer structure by forming the first electrode of an organic light emitting display device with the front light emitting structure. Accordingly, the organic light emitting display device of the present invention has advantages in that the process is easy because the electrode can be formed by a single coating process, manufacturing cost can be reduced by replacing indium, and short defect can be prevented.

Meanwhile, unlike in FIG. 6, FIG. 7 may be an organic light emitting display device of a rear light emitting or double-sided light emitting structure. The explanation on the same configuration as that of FIG. 6 will be briefly made and those with different configurations will be described herein below.

Referring to FIG. 7, in the organic light emitting display device according to a third exemplary embodiment of the present invention, a first electrode (ANO) is disposed on the organic insulating film (PAC). The first electrode (ANO) may be an anode, transparent, and has a high work function, and the first electrode (ANO) may contain a conductive material, a polymer resin, and a dopant having a work function of at least 5.0 eV. Therefore, the first electrode (ANO) acts as a transparent electrode that transmits light.

A bank layer (BNK) is disposed on the substrate (SUB1) including a first electrode (ANO), and an organic layer (FML) is disposed on the first electrode. A second electrode (CAT) is disposed on the substrate (SUB1) where an organic layer (EML) is formed. The second electrode (CAT) is a cathode an elect ode and has a low work function. When the organic light emitting display device of this exemplary embodiment is a double-sided light emitting stucture, the organic light emitting display device is mad to have a thickness thin enough to transmit light and in the case of a rear light emitting structure, the thickness is thick enough to reflect light.

The organic light emitting display device of FIG. 7 described above is an organic light emitting display device having a double-sided emission or a rear light emitting structure in which light emitted from an organic layer transmits a first electrode. The electrode of the present invention may contain a conductive material, a polymer resin, and a dopant having a work function of at least 5.0 eV, and for example, an electrode with high transmittance and work function may be provided by including a silver nanowire, a polymer resin, and a dopant having a work function of at least 5.0 eV. Accordingly, the electrode of the present invention has an advantage in that it can be used to form a first electrode of an organic light emitting display device having a rear light emitting or double-sided light emitting structure thereby reducing manufacturing cost by replacing indium.

Meanwhile, referring to FIG. 8, the liquid crystal display according to a fourth exemplary embodiment of the present invention can use the above-described electrode of the present invention as a pixel electrode or common electrode.

Referring to FIG. 8, a gate electrode (GAT) is disposed on a first substrate (SUB1) and a gate insulating film (GI) that insulates the gate electrode (GAT) is disposed on a gate electrode (GAT). An active layer (ACT) is disposed on the gate insulating film (GI), and a source electrode (SE) in contact with one side of the active layer (ACT) and a drain electrode (DE) in contact with the other side of the active layer (ACT) are disposed. Accordingly, a thin film transistor including a gate electrode (GAT), an active layer (ACT), a source electrode (SE), and a drain an electrode (DE) is formed.

An organic insulating film (PAC) is disposed on a first substrate (SUB1) containing a thin film transistor. The organic insulating film (PAC) includes a via hole (VIA) that exposes the drain electrode (DE). A pixel electrode (PXL) and a common electrode (COM) are disposed on the organic insulating film (PAC). The pixel electrode (PXL) is connected to the drain electrode (DE) through a via hole (VIA) formed in the organic insulating film (PAC). The electrode (PXL) and a common an electrode (COM) are alternately arranged to form a horizontal electric field between the pixel electrode (PXL) and the common electrode (COM).

A second substrate (SUB2) opposing the first substrate (SUB1) is disposed and a liquid crystal layer (LC) is disposed between the first substrate (SUB1) and the second substrate (SUB2). In the exemplary embodiment of the present invention, an in-plane switching (IPS) liquid crystal display device in which the pixel electrode and the common electrode are disposed on the same plane has been described as an example. However, the present invention is not limited thereto, and the common electrode may be disposed under the pixel electrode and the common electrode may be disposed on the second substrate.

The above-described electrode of the present invention may be applied to at least one of the pixel electrode (PXL) or common electrode (COM) of a liquid crystal display. The pixel electrode (PXL) or common electrode (COM) may act as an electrode which is transparent and has a high work function, by including a conductive material and a dopant having a work function of at least 5.0 eV.

As described above, the electrode of the present invention may be used as a first electrode of an organic light emitting device and an organic light emitting display device, which require a high work function, by including a conductive material and a dopant having a work function of at least 5.0 eV. Additionally, the electrode of the present invention may be variously applied according to the direction of light emission of an organic light emitting display device, by forming an electrode with high reflectance or an electrode with high transmittance by varying the kinds of the conductive material. Additionally, the electrode of the present invention may be applied to a pixel electrode or common electrode of a liquid crystal display device by forming an electrode having a high transmittance. Additionally, the organic light emitting device and the organic light emitting display device of the present invention have advantages in that the process is easy because the electrode can be formed by a single coating process, manufacturing cost can be reduced by replacing indium, and short defect can be prevented.

Hereinafter, Experimental Examples of a display device having an electrode according to an exemplary embodiment of the present invention will be described. The following Experimental Examples are only illustrative examples of the present invention and the present invention is not limited thereto.

Experimental Example 1: Measurement of Work Function and Reflectance of Electrode An electrode composition was prepared by mixing 0.3 wt % of palladium powder with 100 wt % of silver paste containing 68 wt % of silver powder. The composition was coated on a substrate by spin coating and heat-treated at 200° C. to form an electrode. In particular, palladium powder was added at a varied ratio of 0.6 wt % and 2 wt % to form an additional electrode.

Figure 9:
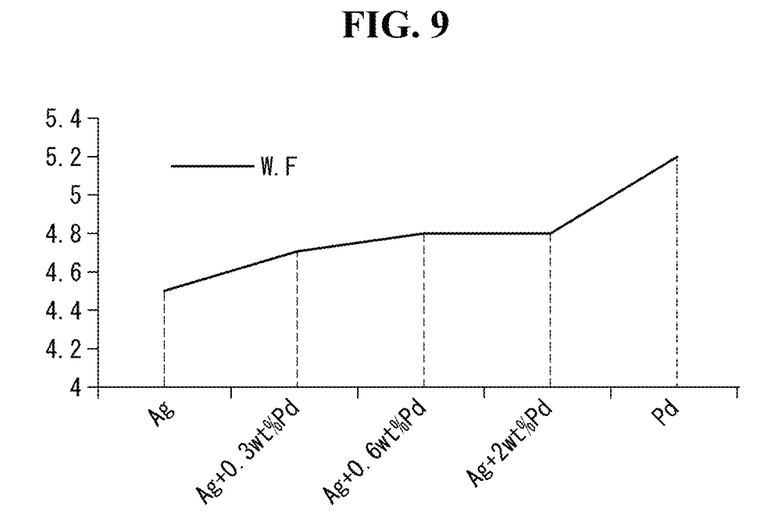
FIG. 9 is a graph showing work functions of electrodes prepared according to Experimental Example 1.

The work functions of the thus-prepared electrodes were measured and the results are shown in FIG. 9. The reflectance of the electrodes was measured and the results are shown in FIG. 10.

Referring to FIG. 9, the silver electrode prepared using silver paste showed a work function of 4.5 eV, the electrode prepared by mixing 0.3 wt % palladium powder with the silver paste showed a work function of 4.7 eV, the electrode prepared by mixing 0.6 wt % palladium powder with the silver paste showed a work function of 4.8 eV, the electrode prepared by mixing 2 wt % palladium powder with the silver paste showed a work function of 4.8 eV, and the palladium electrode prepared using palladium paste showed a work function of 5.2 eV.

From these results, it was confirmed that the work function of an electrode increased as the content ratio of palladium to the silver electrode increased.

Figure 10:
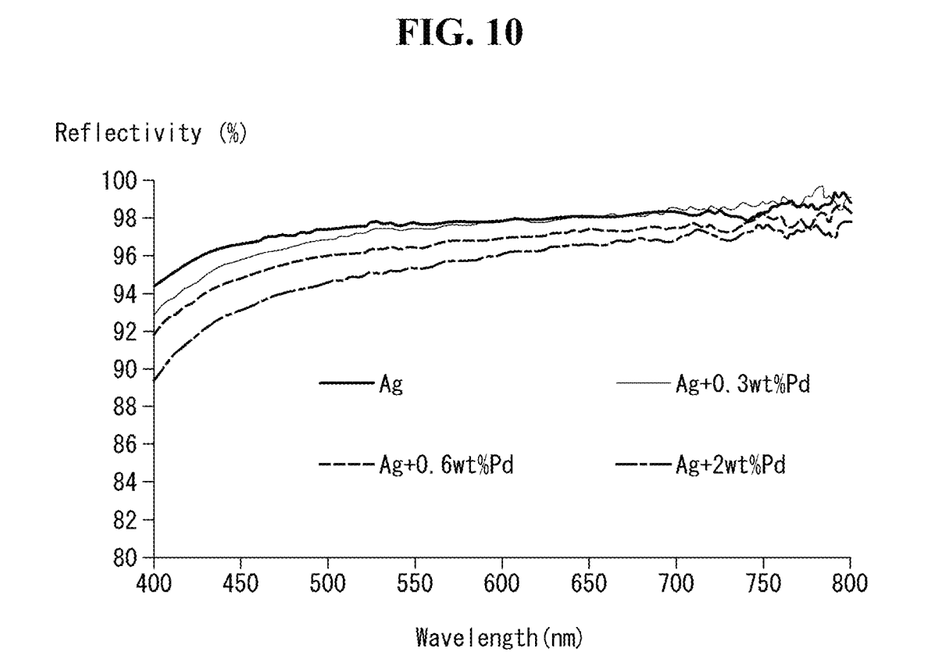
FIG. 10 is a graph showing the reflectance of electrodes prepared according to Experimental Example 1.
Figure 11:
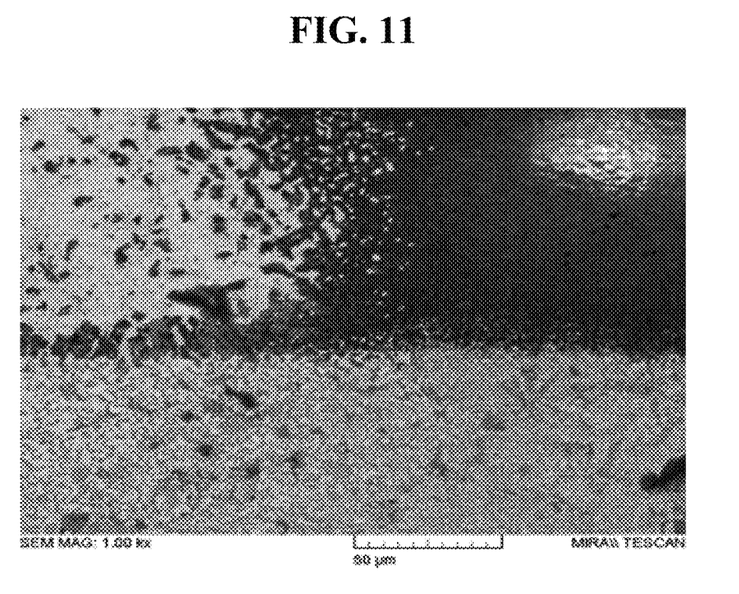
FIG. 11 is an SEM image of an electrode prepared according to Experimental Example 2 in which the palladium powder content is 0 wt %.
Figure 12:
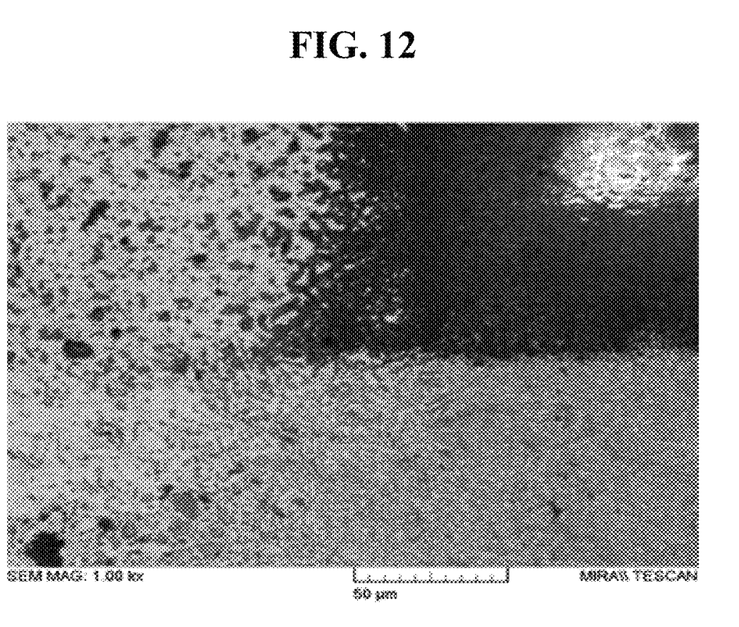
FIG. 12 is an SEM image of an electrode prepared according to Experimental Example 2 in which the palladium powder content is 0.3 wt %.
Figure 13:
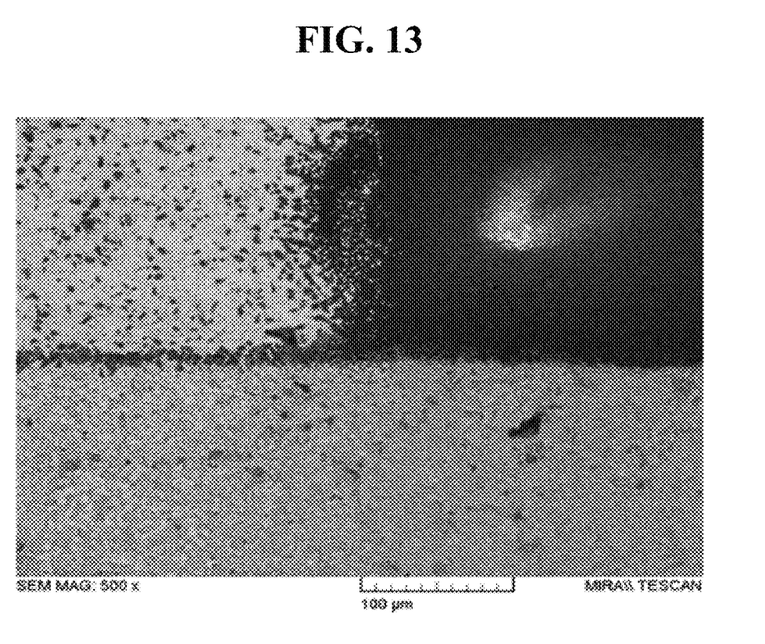
FIG. 13 is an SEM image of an electrode prepared according to Experimental Example 2 in which the palladium powder content is 0.6 wt %.
Figure 14:
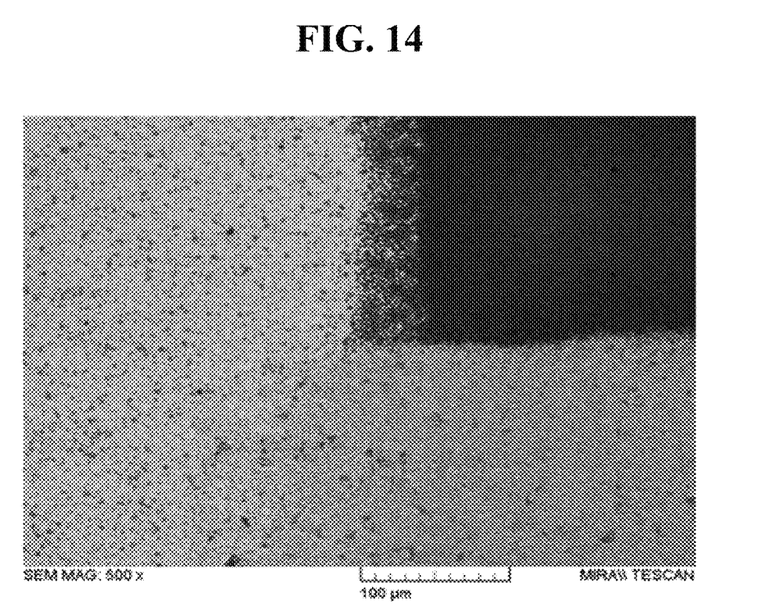
FIG. 14 is an SEM image of an electrode prepared according to Experimental Example 2 in which the palladium powder content is 2 wt %.

Referring to FIG. 10, the silver electrode prepared using silver paste showed a reflectance of 94% to 99% at the wavelength of 400 nm to 800 nm, the electrode prepared by mixing 0.3 wt % palladium powder with the silver paste showed a reflectance of 93% to 99%, the electrode prepared by mixing 0.6 wt % palladium powder with the silver paste showed a reflectance of 92% to 98%, and the electrode prepared by mixing 2 wt % palladium powder with the silver paste showed a reflectance of 89% to 98%.

From these results, it was confirmed that the reflectance of an electrode decreases as the content ratio of palladium to a silver electrode increases.

From Experimental Example 1, it was confirmed that the electrode of the present invention has a trade-off relationship in which a work function increased but a reflectance decreased as the content ratio of a dopant having a work function of at least 5.0 eV increased. Accordingly, in the present invention, an electrode having excellent characteristics of a work function and reflectance can be formed by adjusting the content ratio of a dopant having a work function of at least 5.0 eV in a range of 2 wt % to 10 wt %.

Experimental Example 2: Measurement of Sintering Degree of Electrode

Electrode compositions were prepared by mixing 0 wt %, 0.3 wt %, 0.6 wt %, and 2 wt % of palladium powder with 100 wt % of silver paste containing 68 wt % of silver powder, respectively. Each of the electrode compositions was coated on each substrate by spin coating and heat-treated at 200° C. to form electrodes.

SEM images of the thus-prepared electrodes are shown in FIGS. 11, 12, 13, and 14, in the order of 0 wt %, 0.3 wt %, 0.6 wt %, and 2 wt % of palladium powder content, respectively.

Referring to FIGS. 11 to 14, it was confirmed that as the palladium powder content increased in the order of 0 wt %, 0.3 wt %, 0.6 wt %, and 2 wt %, the sintering degree increased according to the difference in flowability of silver (Ag).

From Experimental Example 2, it was confirmed that in the electrode of the present invention the sintering degree of an electrode increased as the content ratio of a dopant having a work function of at least 5.0 eV increased. Accordingly, in the present invention, an electrode having an excellent sintering degree can be formed by adjusting the dopant having a work function of at least 5.0 eV in a range of 2 wt % to 10 wt %.

Experimental Example 3: Measurement of Light Emission of Device

Comparative Example

A device was manufactured by depositing an ITO electrode as an anode on a substrate, followed by subsequent formation of a hole transport layer, an emitting layer, an electron transport layer, an electron injection layer, and an aluminum electrode as a cathode on an ITO electrode. In particular, the ITO electrode had a work function of 4.7 eV.

Example

An electrode composition was prepared on a substrate by mixing a PEDOT:PSS a conductive polymer with a carbon nanotube dispersion, in which 1 wt % of silver nanowire was dispersed, and then mixing with 2 wt % palladium powder. The electrode composition was coated on each substrate by spin coating and heat-treated at 200° C. to form an anode electrode. A device was manufactured by sequentially forming a hole transport layer, a light emitting layer, an electron transport layer, an electron injection layer, and an aluminum electrode as a cathode on an anode electrode. In particular, the thus-prepared electrode had a work function of 5.0 eV.

Figure 15:
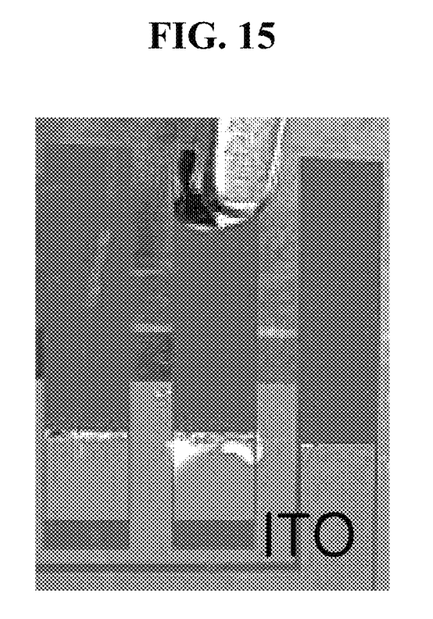
FIG. 15 is an emission image of a device manufactured according to Comparative Example of the present invention.
Figure 16:
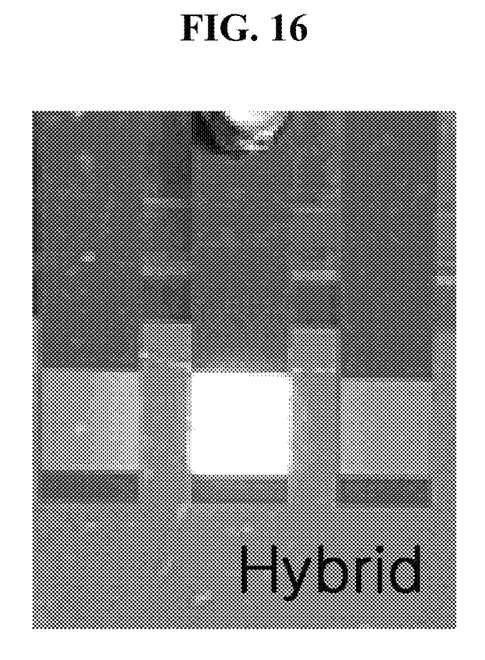
FIG. 16 is an emission image of a device manufactured according to Example of the present invention.

The light emission of the device manufactured according to the above-described Comparative Example and Example was observed. FIG. 15 shows an image illustrating the light emission of the device manufactured according to Comparative Example and FIG. 16 shows an image illustrating the light emission of the device manufactured according to Example.

Referring to FIG. 15, in comparative example where an a hole transport layer was directly formed on the ITO electrode, almost no light was emitted. Meanwhile, referring to FIG. 16, in Example where an electrode containing a conductive material, a polymer resin, and a dopant having a work function of at least 5.0 eV, instead of ITO, was provided, a good emission was observed. In particular, even when a hole transport layer was directly formed on an electrode, the light emission was good.

From these results it was confirmed that the electrode of the present invention can replace ITO and omit the hole injection layer on the anode electrode.

As described above, the electrode according to the present invention can be used as a first electrode of an organic light emitting display device requiring a high work function by including a conductive material and a dopant having a work function of at least 5.0 eV. Additionally, the electrode according to the present invention may be differently applied to an organic light emitting display device according to the direction of light emission by forming an electrode having a high reflectance or an electrode having a high transmittance by varying the kind of the conductive material. Additionally, the electrode according to the present invention may be applied to a pixel electrode or common electrode of a liquid crystal display device by forming an electrode having a high transmittance. Additionally, the organic light emitting device and an organic light emitting display device of the present invention have advantages in that the process is easy because the electrode can be formed by a single coating process, manufacturing cost can be reduced by replacing indium, and short defect can be prevented. Additionally, as the hole injection becomes easy in the organic light emitting device and organic light emitting display device using an electrode according to the present invention as a first electrode, no additionally hole injection layer is needed.

It will be apparent to those skilled in the art that various modifications and variations can be made in the electrode, the organic light emitting diode, the liquid crystal display device, and the organic light emitting display device of the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. An electrode, comprising:
   a conductive material, a polymer resin, and a dopant having a work function of at least 5.0 eV,
   wherein the dopant having a work function of at least 5.0 eV is one selected from the group consisting of selenium (Se), cobalt (Co), iridium (Ir), osmium (Os), and a mixture thereof,
   wherein a content ratio of the dopant in the electrode is in a range of 2 wt % to 10 wt % based on 100 wt % of a conductive material paste,
   wherein the conductive material, the dopant, and the polymer resin are mixed in the conductive material paste to form the electrode,
   wherein the electrode is formed of a single layer,
   wherein the conductive material is a metal particle having a reflectivity of at least 80%, and
   wherein the metal particle is one selected from the group consisting of sodium (Na), silver (Ag), aluminum (Al), magnesium (Mg), tin (Sn), gold (Au), and a mixture thereof.

2. The electrode of claim 1, wherein the electrode has a work function of at least 4.8 eV.

3. An organic light emitting device, comprising:
   a first electrode, which comprises a conductive material, a polymer resin, and a dopant having a work function of at least 5.0 eV;
   an organic layer, which comprises a light emitting layer on the first electrode; and
   a second electrode on the organic layer,
   wherein the dopant having a work function of at least 5.0 eV is one selected from the group consisting of selenium (Se), cobalt (Co), iridium (Ir), osmium (Os), and a mixture thereof,
   wherein a content ratio of the dopant in the electrode is in a range of 2 wt % to 10 wt % based on 100 wt % of a conductive material paste,
   wherein the conductive material, the dopant, and the polymer resin are mixed in the conductive material paste to form the first electrode, and
   wherein the first electrode is formed of a single layer.

4. The organic light emitting device of claim 3, wherein the conductive material is one selected from the group consisting of a metal particle having a reflectivity of at least 80%, a carbon allotrope, a conductive polymer, metal nanowire, and a mixture thereof.

5. The organic light emitting device of claim 4, wherein the metal particle having a reflectivity of at least 80% is one selected from the group consisting of sodium (Na), silver (Ag), aluminum (Al), magnesium (Mg), tin (Sn), gold (Au), and a mixture thereof.

6. The organic light emitting device of claim 4, wherein the carbon allotrope is one selected from the group consisting of reduced graphene oxide (rGO), non-oxidized graphene, graphene nanoribbon, carbon nanotube (CNT), and a mixture thereof.

7. The organic light emitting device of claim 3, wherein the electrode has a work function of at least 4.8 eV.

8. The organic light emitting device of claim 4, wherein the conductive polymer is one selected from the group consisting of a conductive polymer not comprising a heteroatom, which includes polyfluorene, polyphenylene, polypyrene, polyazulene, polynaphthalene, polyacetylene (PAC), and poly(p-phenylene vinylene) (PPV); a conductive polymer comprising nitrogen (N) as a heteroatom, which includes polypyrrole (PPY), polycarbazole, polyindole, polyazepine, poly(thienylene vinylene), and polyaniline (PANI); a conductive polymer comprising sulfur (S) as a heteroatom, which includes poly(thiophene) (PT), poly(p-phenylene sulfide) (PPS), and poly(3,4-ethylenedioxy thiophene) (PEDOT); a conductive polymer comprising oxygen (O) as a heteroatom, which includes polyfuran; or any of the conductive polymers in which a different material is doped on any of these conductive polymers; and a combination thereof.

9. The organic light emitting device of claim 3, wherein the first electrode is a reflective electrode or transparent electrode.

10. The organic light emitting device of claim 3, wherein the organic layer further comprises an organic layer, a hole transport layer, and an electron transport layer, an electron injection layer, and the first electrode is in direct contact with the hole transport layer.

11. A liquid crystal display, comprising:
    a first substrate including a thin film transistor;
    a second substrate opposing the first substrate;
    an electrode according to claim 1, which is disposed on the thin film transistor and electrically connected to the thin film transistor; and
    a liquid crystal layer disposed between the first and second substrates.

12. An organic light emitting display device, comprising:
    a substrate including a thin film transistor;
    an organic light emitting device according to claim 3, which is disposed on the thin film transistor and electrically connected to the thin film transistor; and
    an encapsulation layer disposed on the organic light emitting device.

* * * * *